(12) United States Patent
Yamazaki et al.

(10) Patent No.: US 7,222,981 B2
(45) Date of Patent: *May 29, 2007

(54) EL DISPLAY DEVICE AND ELECTRONIC DEVICE

(75) Inventors: Shunpei Yamazaki, Setagaya (JP); Yasuyuki Arai, Atsugi (JP); Mayumi Mizukami, Atsugi (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/271,921

(22) Filed: Nov. 14, 2005

(65) Prior Publication Data

US 2006/0077651 A1 Apr. 13, 2006

Related U.S. Application Data

(63) Continuation of application No. 09/783,426, filed on Feb. 15, 2001, now Pat. No. 6,965,195.

(51) Int. Cl.
*H01J 1/62* (2006.01)

(52) U.S. Cl. .................. 362/84; 313/498; 313/512

(58) Field of Classification Search .................. 362/84, 362/561, 559; 313/498, 512, 504, 505, 506, 313/509; 257/99, 100, 72
See application file for complete search history.

(56) References Cited

U.S. PATENT DOCUMENTS

| | | | |
|---|---|---|---|
| 5,107,175 A | 4/1992 | Hirano et al. ............... 313/512 |
| 5,124,204 A | 6/1992 | Yamashita et al. .......... 428/337 |
| 5,189,405 A | 2/1993 | Yamashita et al. .......... 313/512 |
| 5,686,360 A | 11/1997 | Harvey, III et al. .......... 438/28 |
| 5,693,956 A | 12/1997 | Shi et al. .................... 257/40 |
| 5,757,126 A | 5/1998 | Harvey, III et al. .......... 313/506 |
| 5,771,562 A | 6/1998 | Harvey, III et al. ........ 29/562.1 |
| 5,811,177 A | 9/1998 | Shi et al. .................... 428/209 |
| 5,882,761 A | 3/1999 | Kawami et al. ............... 428/69 |
| 5,952,778 A | 9/1999 | Haskal et al. ............... 313/506 |
| 5,973,258 A | 10/1999 | Shiotsuka et al. .......... 136/252 |

(Continued)

FOREIGN PATENT DOCUMENTS

EP 0 883 191 12/1998

(Continued)

OTHER PUBLICATIONS

"Solar Cell Handbook"; Institute of Electrical Engineers of Japan, Investigation Committee of a Solar Cell ed.; pp. 165-166; 1985 (filed with concise statement in parent).

(Continued)

*Primary Examiner*—Sandra O'Shea
*Assistant Examiner*—Bao Q. Truong
(74) *Attorney, Agent, or Firm*—Fish & Richardson P.C.

(57) ABSTRACT

A cover member is adhered onto a substrate on which an EL element is formed with a filler as an adhesive. Further, a sealing member is provided so as to cover a side surface (an exposing surface) of the filler, and a frame member is adhered using the sealing member. With this structure, the EL element is completely sealed by the filler, and shut from moisture and the like from the outside. Thus, deterioration of an EL layer due to oxidization can be prevented.

18 Claims, 9 Drawing Sheets

U.S. PATENT DOCUMENTS

| | | | |
|---|---|---|---|
| 5,990,542 A | 11/1999 | Yamazaki | 257/642 |
| 5,990,615 A | 11/1999 | Sakaguchi et al. | 313/504 |
| 6,146,225 A | 11/2000 | Sheats et al. | 445/24 |
| 6,147,451 A | 11/2000 | Shibata et al. | |
| 6,149,757 A | 11/2000 | Chikaki et al. | 156/286 |
| 6,150,187 A | 11/2000 | Zyung et al. | 438/26 |
| 6,175,345 B1 | 1/2001 | Kuribayashi et al. | 345/70 |
| 6,198,217 B1 | 3/2001 | Suzuki et al. | 313/504 |
| 6,198,220 B1 | 3/2001 | Jones et al. | 313/512 |
| 6,268,695 B1 | 7/2001 | Affinito | 313/506 |
| 6,274,887 B1 | 8/2001 | Yamazaki et al. | 237/72 |
| 6,320,115 B1 | 11/2001 | Kataoka et al. | 136/251 |
| 6,323,416 B1 | 11/2001 | Komori et al. | 136/259 |
| 6,373,455 B1 | 4/2002 | Kuribayashi et al. | 345/36 |
| 6,413,645 B1 | 7/2002 | Graff et al. | 428/446 |
| 6,445,005 B1 | 9/2002 | Yamazaki et al. | 257/72 |
| 6,641,933 B1 * | 11/2003 | Yamazaki et al. | 313/504 |
| 6,833,668 B1 | 12/2004 | Yamada et al. | |
| 6,965,195 B2 * | 11/2005 | Yamazaki et al. | 313/498 |
| 2002/0190257 A1 | 12/2002 | Yamazaki et al. | 257/72 |

FOREIGN PATENT DOCUMENTS

| | | |
|---|---|---|
| EP | 0 999 595 | 5/2000 |
| EP | 1 058 484 | 12/2000 |
| EP | 1 085 576 | 3/2001 |
| JP | 64-024395 | 1/1989 |
| JP | 02-140796 | 5/1990 |
| JP | 02-140796 | 11/1990 |
| JP | 06-267654 | 9/1994 |
| JP | 07-169567 | 7/1995 |
| JP | 08-068990 | 3/1996 |
| JP | 08-096959 | 4/1996 |
| JP | 08-283416 | 10/1996 |
| JP | 09-148066 | 6/1997 |
| JP | 10-241857 | 9/1998 |
| JP | 10-275682 | 10/1998 |
| JP | 10-289784 | 10/1998 |
| JP | 10-333601 | 12/1998 |
| JP | 11-040344 | 2/1999 |
| JP | 11-054268 | 2/1999 |
| JP | 11-067451 | 3/1999 |
| JP | 2000-173766 | 6/2000 |
| JP | 2001-093661 | 4/2002 |

OTHER PUBLICATIONS

Japanese Office Action with a partial English translation, Application Serial No. 11-268153, dated Jul. 4, 2006, 5 pages.

* cited by examiner

FIG. 9B ion is to provide an EL display device with high reliability. Further, another object of the present invention is to provide an electronic device using such an EL display device with high reliability as its display portion.
EL DISPLAY DEVICE AND ELECTRONIC DEVICE

CROSS-REFERENCE TO RELATED APPLICATION

This application is a continuation application of U.S. application Ser. No. 09/783,426, filed on Feb. 15, 2001 now U.S. Pat. No. 6,965,195, now allowed. This application claims priority to this application and this application is incorporated by reference.

TECHNICAL FIELD

The present invention relates to an EL (electroluminescence) display device and an electronic device using the display device, and more specifically, relates to a technique for preventing deterioration of an EL element.

PRIOR ART

In recent years, development of a display device using an EL element as a self-light emitting element that utilizes an EL phenomenon of an organic material (EL display device) is being progressed. The EL display device is a self-light emitting type, and thus, does not need a back light unlike a liquid crystal display device. Further, the EL display device has a wide viewing angle, and therefore, is promising as a display portion of a portable device used outdoors.

SUMMARY

In one general aspect, an EL display device includes a substrate on which an EL element is formed, a cover member, a filler for adhering said substrate on which the EL element is formed to said cover member, a sealing member for covering a side surface of said filler, and a frame member adhered with said sealing member.

In another general aspect, an EL display device includes an active matrix substrate on which a TFT and an EL element electrically connected with the TFT are formed, a cover member, a filler for adhering said active matrix substrate to said cover member, a sealing member for covering a side surface of said filler, and a frame member adhered with said sealing member.

In another general aspect, an EL display device includes a substrate on which an EL element composed of an anode arranged in a stripe, a cathode arranged in a stripe so as to be perpendicular to said anode, and an EL layer formed between said anode and said cathode, a cover member, a filler for adhering said substrate on which the EL element is formed to said cover member, a sealing member for covering a side surface of said filler, and a frame member adhered with said sealing member.

Implementations of the EL display devices may include one or more the following features. For example, the EL display devices may include a drying agent in the filler. The drying agent may include barium oxide. The drying agent may have a granular shape with an average diameter of 100 μmØ, and a density of $1 \times 10^2$ to $1 \times 10^5$ atoms/cm$^3$. The cover member may be provided with a light shielding film or color filter. An electronic device and/or a portable telephone may include the EL display devices in a display portion thereof.

An object of the present invention is to provide an EL display device with high reliability. Further, another object of the present invention is to provide an electronic device using such an EL display device with high reliability as its display portion.

DETAILED DESCRIPTION

Figure 1A:
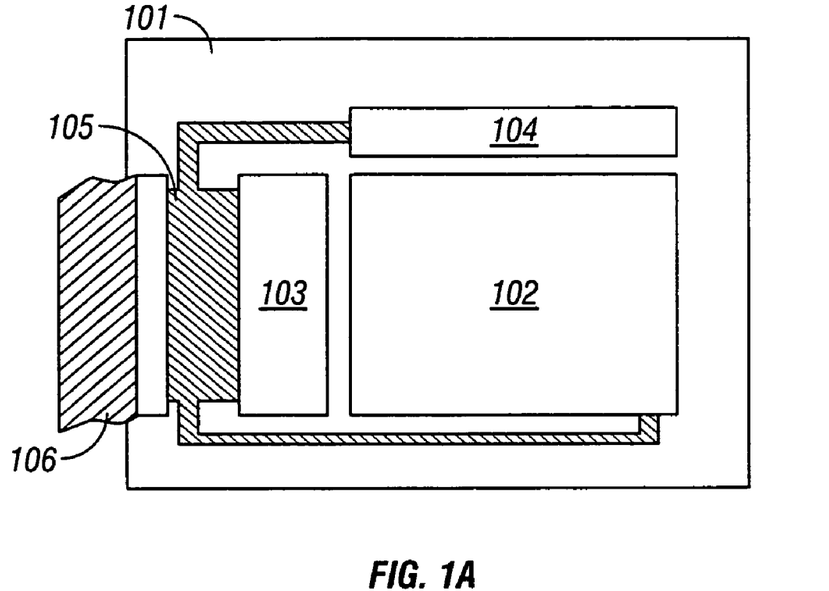
FIG. 1A is a side view of an EL display device without a sealing structure.

A structure of the present invention is explained with reference to FIG. 1. FIG. 1A shows an EL display device of the present invention in a state that a sealing structure for sealing an EL element in a sealing space is not provided.

In FIG. 1A, reference numeral 101 indicates a substrate, 102 indicates a pixel portion, 103 indicates a source side driver circuit, 104 indicates a gate side driver circuit, and 105 indicates a connection wiring for electrically connecting the pixel portion 102, the source side driver circuit 103, and the gate side driver circuit 104 to a flexible printed circuit (FPC) 106. Further, the FPC is electrically connected to an external apparatus, whereby a signal from the outside can be input to the pixel portion 102, the source side driver circuit 103, and the gate side driver circuit 104.

The pixel portion 102, the source side driver circuit 103, and the gate side driver circuit 104 are formed of thin film transistors (hereinafter referred to as TFTs) formed on the substrate 101. Note that TFTs having any structure may be used as the TFTS. Of course, the TFTs may adopt a known structure.

Figure 1B:
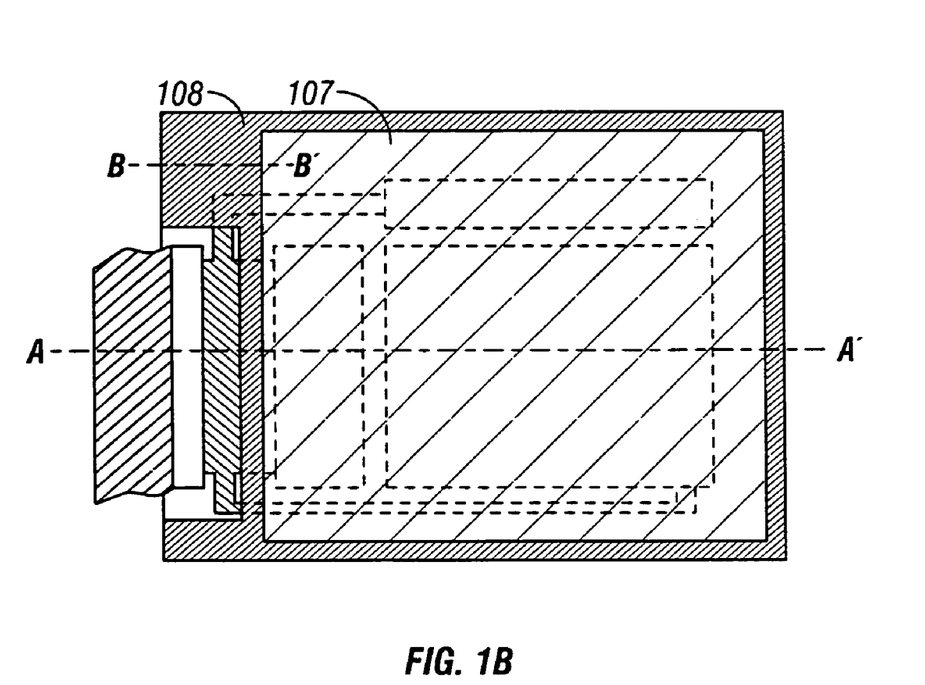
FIG. 1B is a side view of the EL display device of FIG. 1B with a sealing structure.

FIG. 1B shows a state that the sealing structure is provided in the state of FIG. 1A. The sealing structure of the present invention includes a filler (not shown), a cover member 107, a sealing member (not shown), and a frame member 108.

Figure 2A:
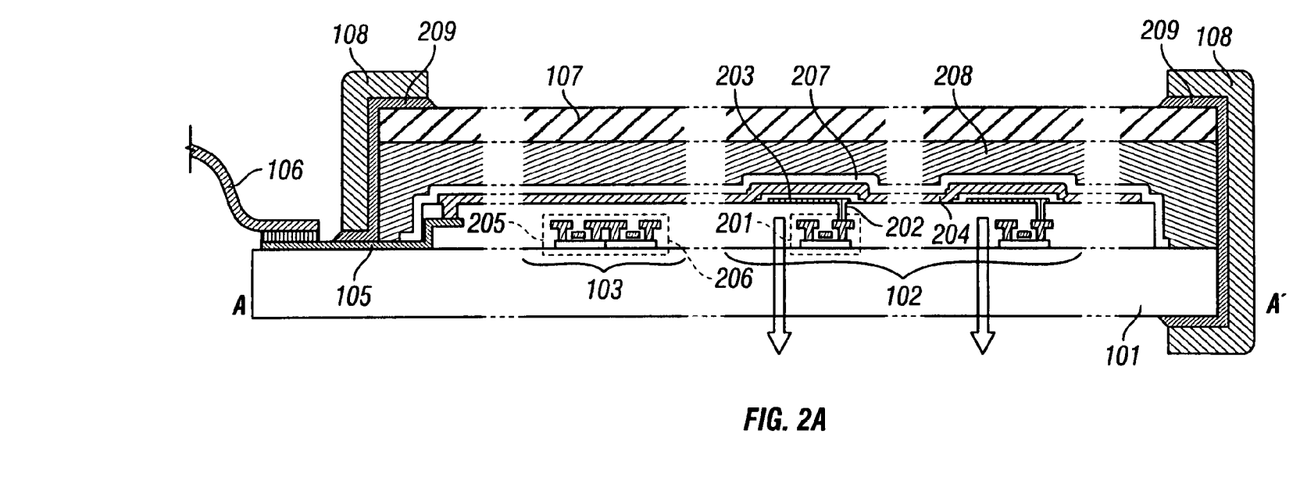
FIG. 2A is a cross-sectional side view of the EL display device of FIG. 1B taken along section lines A–A'.
Figure 2B:
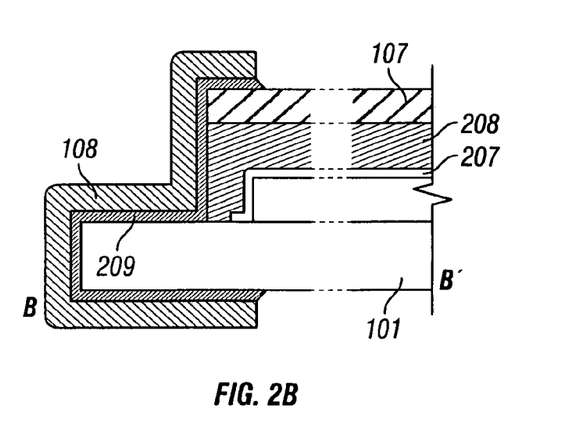
FIG. 2B is a cross-sectional side view of the EL display device of FIG. 1B taken along section lines B–B'.

Here, the cross-sectional view taken along with a line A–A' of FIG. 1B and the cross-sectional view taken along with a line B–B' of FIG. 1B are shown in FIG. 2A and FIG.

2B, respectively. In FIGS. 2A and 2B, the same reference numerals are used for the same portions as in FIGS. 1A and 1B.

As shown in FIG. 2A, the pixel portion 102 and the driver circuit 103 are formed on the substrate 101, and the pixel portion 102 is formed by a plurality of pixels each including a current control TFT 201 and a pixel electrode 202 electrically connected therewith. This pixel electrode 202 functions as an anode of an EL element. Further, an EL layer 203 is formed so as to cover the pixel electrode 202, and a cathode 204 of the EL element is formed thereon.

Note that, in this specification, an element composed of an anode/an EL layer/a cathode is referred to as an EL element. In actuality, an electric current is made to flow between the anode and the cathode, and an electron and a hole are recombined in the EL layer, thereby obtaining light emission.

Further, there is no particular limitation on the structure of the EL element in the present invention. Generally, a film having a large work function, for example, a transparent conductive film is used as the anode, and a film having a small work function, for example, a film containing alkali metal or alkaline-earth metals is used as the cathode. In addition, the EL layer can adopt any known structure.

Note that, in this specification, the EL layer refers to a layer that provides the place for transfer, transportation, or recombination of carriers, which is located between the anode and the cathode. There may be a case where the EL layer is comprised of only a light-emitting layer that becomes the center of recombination. However, the light emitting layer in combination with an electron injecting layer, an electron transporting layer, a hole injecting layer, and a hole transporting layer is generally used.

Further, there are inorganic materials and organic materials for a material forming the EL layer. The organic materials sufficed with a small driving voltage are preferable. Further, there are low molecular weight materials and high molecular weight (polymer) materials in the organic materials. The high molecular weight materials are effective in terms of high heat-resistance and easy film deposition.

Incidentally, the pixel portion 102 and the driver circuit 103 are simultaneously formed. The driver circuit 103 is formed by a CMOS circuit as a base unit, in which an n-channel TFT 205 and a p-channel TFT 206 are complementarily combined, in many cases.

Further, the cathode 204 also functions as a common wiring to all the pixels, and is electrically connected with the FPC 106 through the connection wiring 105. Besides, all the elements included in the pixel portion 102 and the driver circuit 103 are covered by a passivation film 207. The passivation film 207 can be omitted, but it is preferable to provide the film in order to shut the respective elements from the outside.

Next, a filler 208 is provided so as to cover the EL element. This filler 208 functions also as an adhesive for adhering the cover member 107. As the filler 208, a PVC (polyvinyl chloride), an epoxy resin, a silicone resin, a PVB (polyvinyl butyral), or an EVA (ethylene vinyl acetate) can be used. It is preferable that a drying agent is provided inside the filler 208, thereby being capable of maintaining a moisture absorbing effect.

Further, as the cover member 107, a glass plate, an aluminum plate, a stainless plate, an FRP (fiberglass-reinforced plastics) plate, a PVF (polyvinyl fluoride) film, a mylar film, a polyester film, or an acrylic film may be used. Note that, in the case where PVB or EVA is used as the filler 208, it is preferable to use a sheet having a structure in which an aluminum foil with a thickness of several tens of µm is sandwiched by the PVF film or the mylar film.

Note that the cover member 107 may need to have a light transmitting property depending on a light emission direction (light radiation direction) from the EL element. Namely, since light is radiated to the side opposite to the cover member 107 in case of FIG. 2, it does not matter what material is used for the cover member 107. However, in the case where light is radiated to the cover member 107 side, it is preferable that the cover member 107 is formed from the material having high transmissivity.

Next, after the cover member 107 is adhered using the filler 208, the frame member 108 is attached so as to cover a side surface (exposing surface) of the filler 208. The frame member 108 is adhered by a sealing member (functioning as an adhesive) 209. At this time, a photo curable resin is preferably used as the sealing member 209, but a thermosetting resin may be used if the heat-resistance of the EL layer permits. Note that the sealing member 209 is preferably formed from a material that does not transmit moisture or oxygen as much as possible. Further, a drying agent may be added inside the sealing member 209.

The EL element can be completely shut from the outside by sealing the EL element into the filler 208 with the above method, and the substances, which promote deterioration of the EL layer due to oxidization, such as moisture and oxygen can be prevented from permeating the EL element from the outside. Therefore, the EL display device with high reliability can be manufactured.

Figure 3:
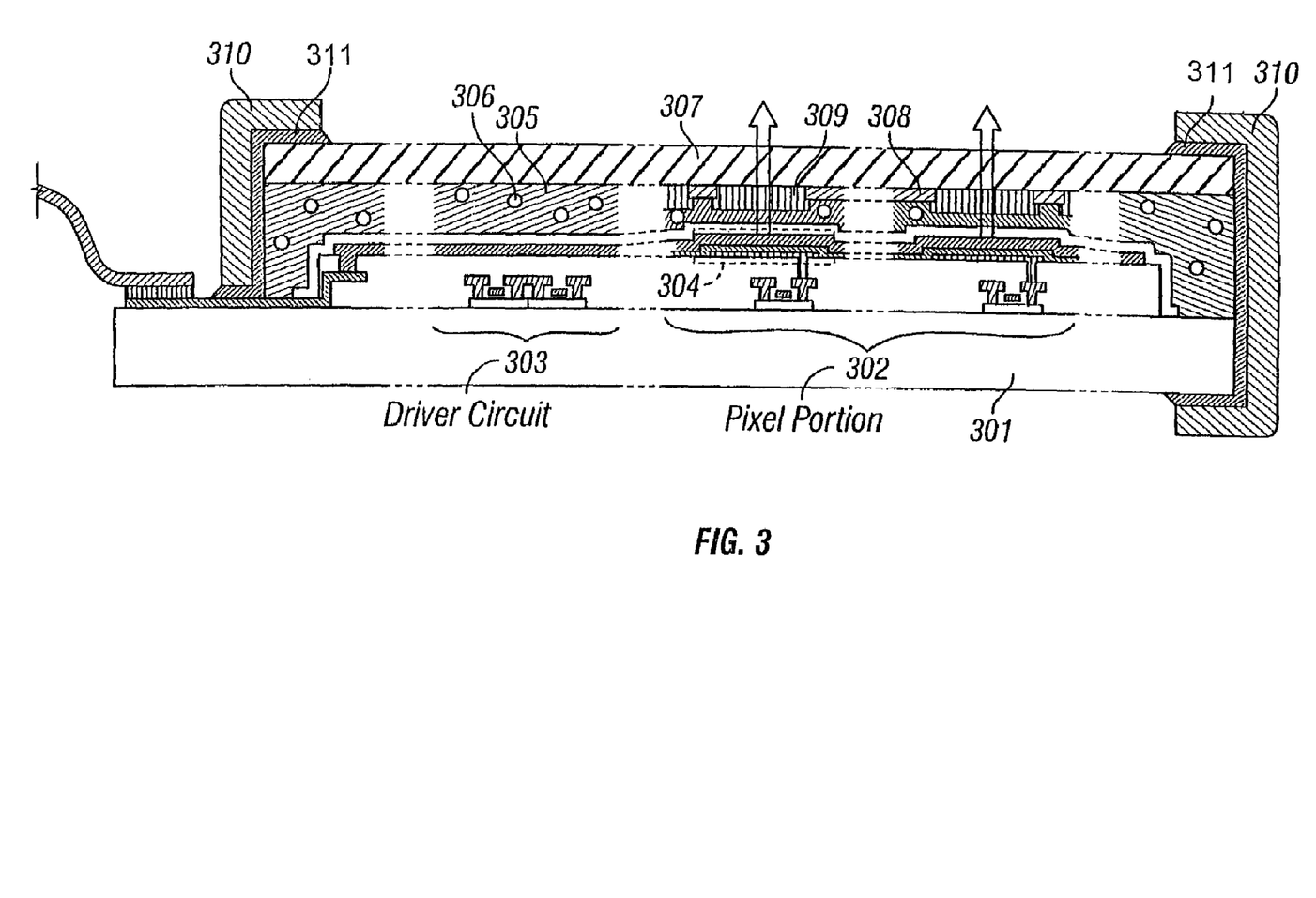
FIG. 3 is a cross-section side view of an EL display device.

Embodiment mode of the present invention is explained with reference to FIG. 3. FIG. 3 is a cross-sectional view of an EL display device of the present invention. Note that the basic structure is the same as FIG. 2A, and thus, the explanation is made as the need arises.

In the EL display device of FIG. 3, a pixel portion 302 and a driver circuit 303 are formed by TFTs formed on a glass substrate 301. Further, a current control TFT formed in the pixel portion 302 is electrically connected with an EL element 304. Note that, instead of the glass substrate, a quartz substrate, a silicon substrate, a stainless substrate, a plastic substrate (including a plastic film), or a ceramics substrate may be used. Note that an insulating film needs to be provided on the substrate depending on the situation.

Further, in this embodiment mode, an EL layer containing a light emitting layer made from a high molecular weight organic material and an anode formed from a transparent conductive film common to respective pixels are formed on a pixel electrode (cathode) connected with the current control TFT, thereby obtaining the EL element. As the high molecular weight organic material, any known material may be used, or a lamination of low molecular weight organic materials may be used. Also, any known lamination structure may be adopted. In this embodiment mode, a white color light emitting layer is formed on the cathode in accordance with Japanese Patent Application Laid-open No. Hei 8–96959. As the transparent conductive film that becomes the anode, a compound of indium oxide and tin oxide, a compound of indium oxide and zinc oxide, tin oxide, or zinc oxide may be used.

PVB is provided as a filler 305 on an active matrix substrate including the above structure, and barium oxide as a drying agent 306 is included in the filler 305. In addition to barium oxide, the substances described in Japanese Patent Application Laid-open No. Hei 9–148066 may be used. Further, the addition of the drying agent is not essential in the present invention, but is preferable in order to increase the reliability more.

Note that the drying agent may be added in any form. However, dispersing the drying agent with a cluster shape may be the cause of dropping brightness of an image, and thus, the drying agent is preferably dispersed with a small granular shape as much as possible. The preferable state is such that the granular-shape drying agent with an average diameter of 100 µmΦ or less is included with a density of $1\times10^2$ to $1\times10^5$ atoms/cm$^3$.

A glass substrate as a cover member 307 is provided on the filler 305. In this embodiment mode, the cover member 307 needs to have a light transmitting property. This is because light emitted from the light emitting layer transmits the cover member 307 to reach an observer in accordance with the structure of the EL element. Of course, instead of the glass substrate, a plastic substrate (including a plastic film), a quartz substrate, or a PVF film may be used as the cover member 307.

Further, in this embodiment mode, the cover member 307 is provided with a light shielding film 308 and a color filter 309. A resin containing black pigment or carbon may be used for the light shielding film 308. Of course, a metal film such as a titanium film, a tantalum film, or a tungsten film may be used. Besides, a resin containing red, green, or blue pigment may be used for the color filter 309. A known method such as an ink jet method or a spin coating method may be used for a method of depositing the light shielding-film 308 and the color filter 309.

In this embodiment mode, a single layer of a white color light emitting layer is used as the EL element, and the white color light emitted from the layer is color-separated by the color filter to obtain colors of red, green and blue. Thus, color display is enabled. Note that a color display method usable in the present invention may be any known method. Further, not only color display but also monochrome display with single color emission is possible.

Figure 4:
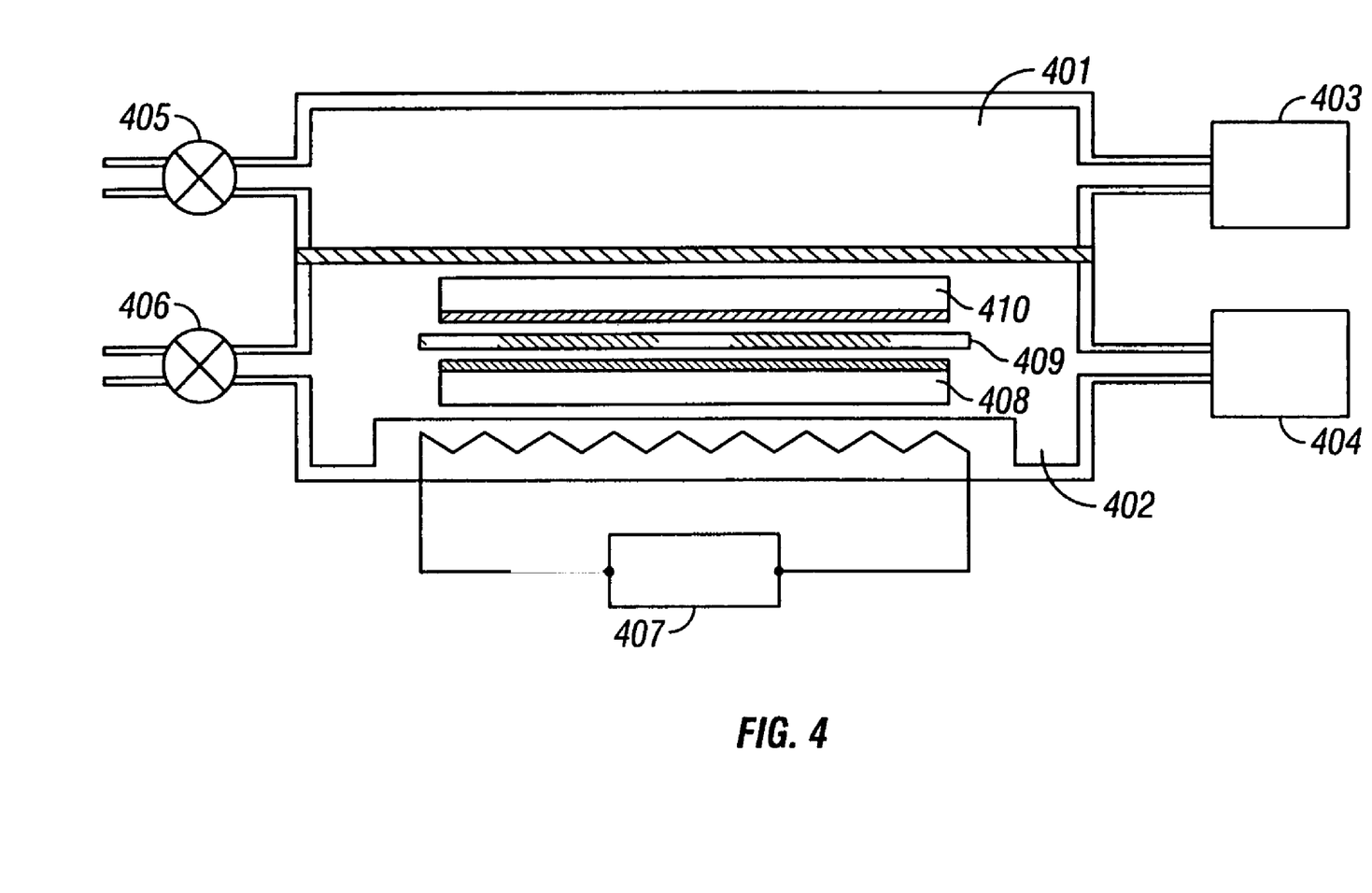
FIG. 4 is a plan view of a bonding apparatus of a double vacuum system.

Here, a method of adhering the cover member 307 using the filler 305 is described with reference to FIG. 4. The apparatus shown in FIG. 4 is a bonding apparatus of a system called a double vacuum system. This bonding apparatus has a first vacuum chamber 401 and a second vacuum chamber 402, and each of the chambers is provided with a first exhaust means 403, a second exhaust means 404, a first leak valve 405, and a second leak valve 406.

Further, the second vacuum chamber 402 is provided with a heating means 407, and the temperature inside the first vacuum chamber 401 can be raised by resistance heating. Moreover, an active matrix substrate (substrate finished through the formation of the TFT and the EL element) 408, a PVB film 409, and a cover member 410 are arranged within the second vacuum chamber 402.

Next, the inside of the first vacuum chamber 401 and the second vacuum chamber 402 is exhausted to form a vacuum. Then, the inside of the second vacuum chamber 402 is heated to approximately 120° C. by the heating means 407 in this state, and thus, the PVB film 409 exhibits flowability. When the PVB film 409 shows the flowability, the leak valve 405 of the first vacuum chamber 401 is opened, and the inside of the first vacuum chamber 401 is exposed to an atmosphere to be pressurized.

When the first vacuum chamber 401 is pressurized, a diaphragm (formed of silicone, rubber or the like) that partitions the first vacuum chamber 401 and the second vacuum chamber 402 pressures the cover member 410 of the second vacuum chamber 402, and the active matrix substrate 408 and the cover member 410 are completely adhered by the filler 409. Thereafter, the second vacuum chamber 402 is returned to a room temperature, and exposed to the atmosphere by the leak valve 406. Note that the second vacuum chamber 402 may be forcedly cooled by circulating a cooling water or the like.

As described above, a process of bonding the active matrix substrate to the cover member is conducted. Note that the double vacuum system is used in this embodiment mode, but a single vacuum system may also be used. Either technique is described in detail in "Solar Cell Handbook, Institute of Electrical Engineers of Japan, Investigation Committee of a Solar Cell ed., pp. 165–166, 1985".

In this way, the active matrix substrate and the cover member 307 are bonded to each other by the filler 305. Then, a frame member 310 is adhered by the sealing member 311 to completely cover the end surface of the filler 305. In this embodiment mode, an ultraviolet ray curing epoxy resin is used as the sealing member 311, and a stainless material is attached as the frame member 310.

The EL display device as shown in FIG. 3 is thus completed. Since moisture and oxygen do not permeate such an EL display device from the outside, deterioration of the EL layer can be prevented, and the life of the EL element is long. That is, the EL display device has very high reliability.

EMBODIMENTS

Embodiment 1

Figure 5:
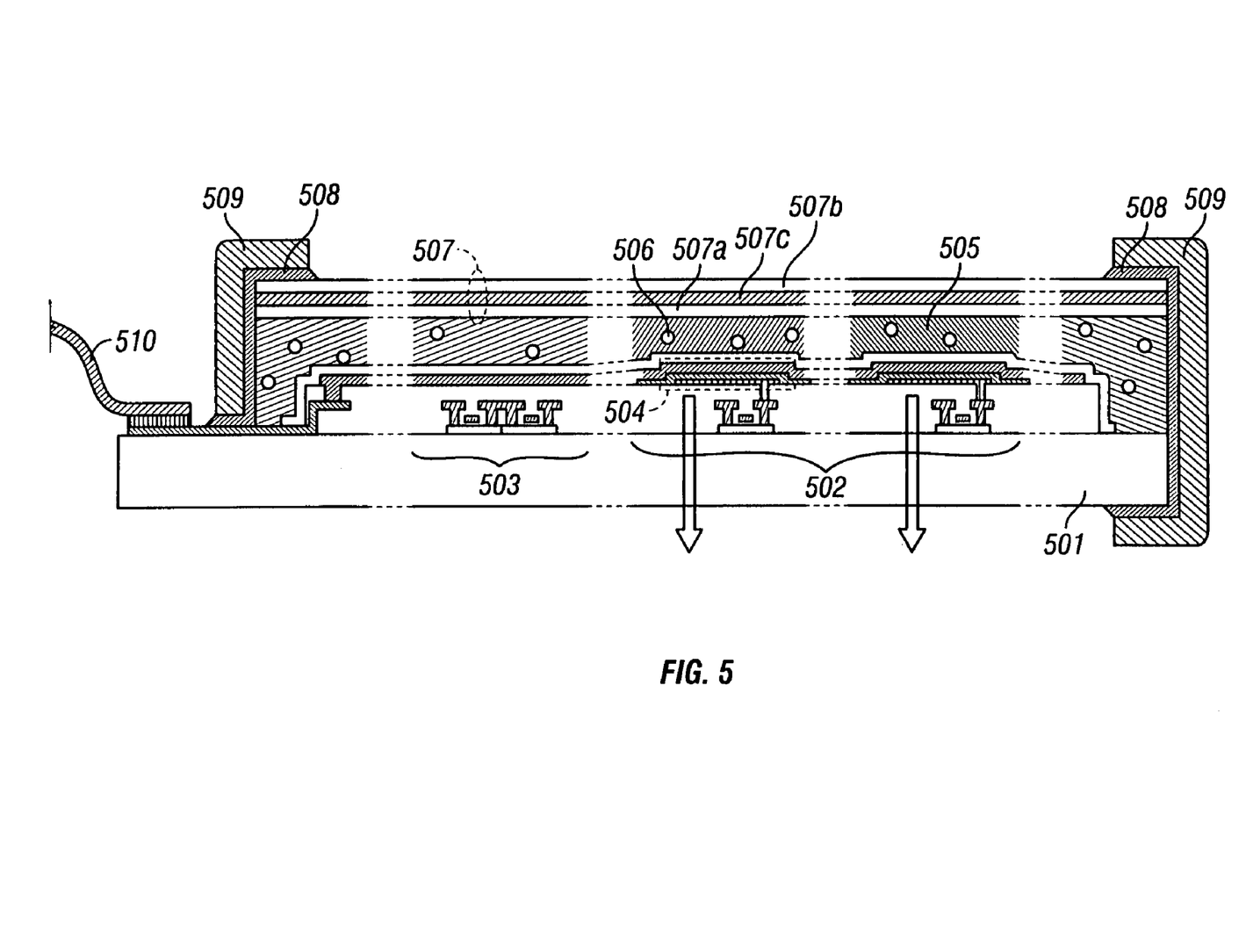
FIG. 5 is a cross-sectional side view of an EL display device in which a PVF film is used as a cover member.

In this embodiment, an example of using a PVF film as a cover member is shown in FIG. 5. In FIG. 5, reference numeral 501 indicates a light transmitting substrate (a plastic substrate in this embodiment), 502 indicates a pixel portion, 503 indicates a driver circuit, and the respective portions are formed of TFTs. Besides, an EL element 504 is formed in the pixel portion 502, and image display is performed.

A cover member 507 is bonded onto an active matrix substrate finished through the formation of the EL element (or a passivation film thereon) through a filler 505 added with a drying agent 506. The bonding apparatus shown in FIG. 4 may be used in this bonding process. This cover member 507 has a structure in which PVF films 507a and 507b sandwich an aluminum foil 507c. The aluminum foil 507c is provided in order to increase moisture-resistance.

Thereafter, a sealing member 508 made of an ultraviolet ray curing resin is used to attach a frame member 509. In this embodiment, a stainless material is used as the frame member 509. Finally, an FPC 510 is attached to complete an EL display device.

Embodiment 2

Figure 6:
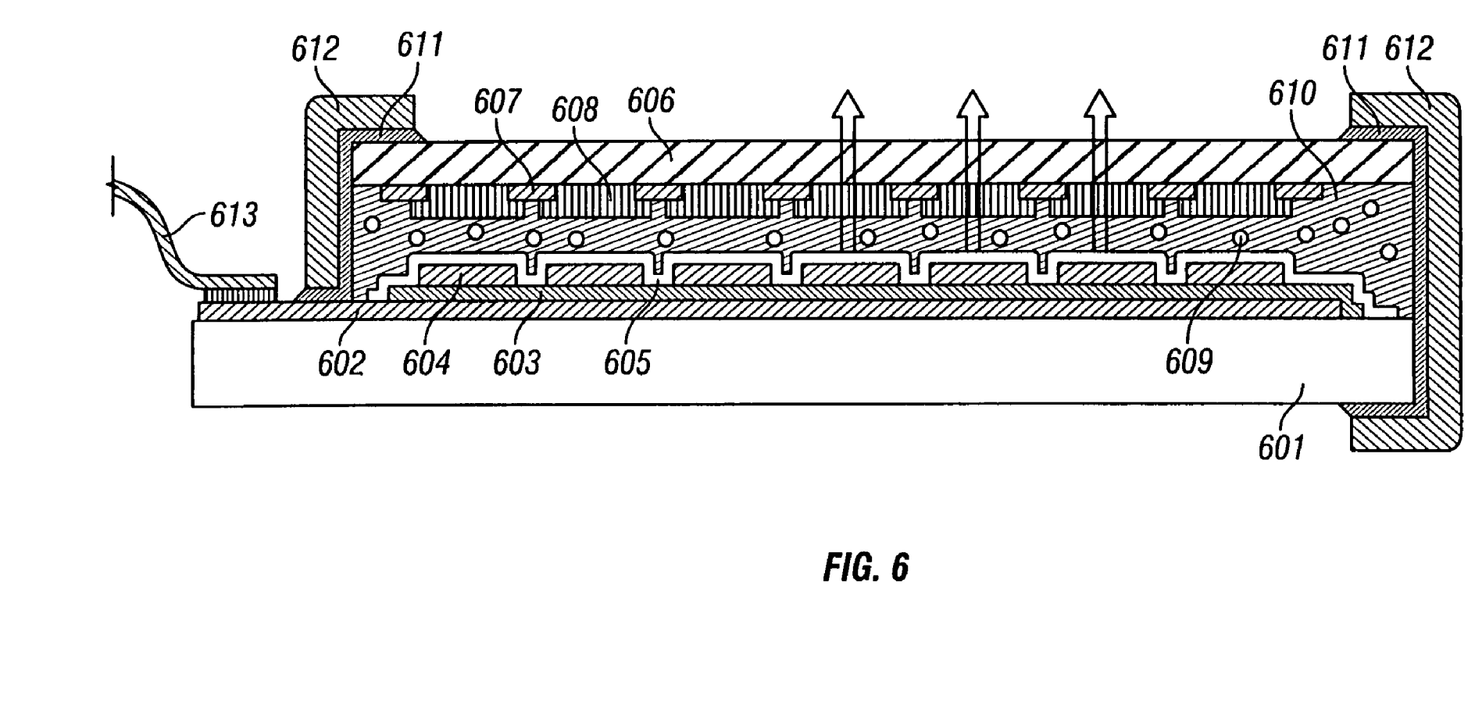
FIG. 6 is a cross-sectional side view of a simple matrix EL display device having a cover member.

In this embodiment, an example of implementing the present invention in a simple matrix EL display device is shown in FIG. 6. In FIG. 6, reference numeral 601 indicates a plastic substrate, and reference numeral 602 indicates a cathode with a lamination structure of an aluminum film and a lithium fluoride film (the lithium fluoride film corresponds to the portion contacting an EL layer). In this embodiment, the cathode 602 is formed by an evaporation method. Note that, although not shown in FIG. 6, a plurality of cathodes is arranged in stripe in a direction perpendicular to the paper.

An EL layer (only a light emitting layer) 603 formed of a high molecular weight organic material is formed on the cathode 602 by a printing method. In this embodiment, PVK (polyvinyl carbazole), Bu-PBD (2-(4'-tert-butylphenyl)-5-(4"-biphenyl)-1,3,4-oxadiazole), coumarin 6, DCM1 (4-dicyanomethylene-2-methyl-6-p-dimethylaminostyryl-4H-pyran), TPB (tetraphenylbutadiene), and nile red are dissolved into 1,2-dichloromethane. The resultant is transferred onto the cathode 602 by the printing method, and then is burned to form the EL layer 603 emitting white light.

Note that, in this embodiment, the EL layer 603 takes a single layer structure of only the light emitting layer described above. However, an electron injecting layer, an electron transporting layer, a hole transporting layer, a hole injecting layer, an electron inhibiting layer, or a hole element layer may be provided if necessary.

After the EL layer 603 is formed, an anode 604 made of a transparent conductive film is formed. In this embodiment, a compound of indium oxide and zinc oxide is formed as the transparent conductive film by the evaporation method. Note that, although not shown in FIG. 6, a plurality of anodes are arranged in stripe such that the direction perpendicular to the paper is a longitudinal direction and that the anode is perpendicular to the cathodes. Further, although not shown in the figure, a wiring line of the anode 604 is drawn out to the portion where an FPC is attached later so as to be applied with a predetermined voltage.

After the anode 604 is formed, a silicon nitride film of 100 nm thickness is formed as a passivation film 605. This is a protective film for not making the EL layer 603 be exposed to an atmosphere in the later adhesion of a cover member and the like.

As described above, an EL element is formed on the substrate 601. Next, a plastic plate is prepared as a cover member 606, and a light shielding film 607 and a color filter 608 are formed on the surface of the cover member 606. A resin containing carbon is used for the light shielding film 607, and a resin containing pigment corresponding to RGB is used for the color filter 608. An ink jet method, a spin coating method, or a printing method may be used for a film deposition method.

Further, since the light emitted from the EL element transmits the cover member 606 to enter observer's eyes with the structure in this embodiment, the cover member 606 has light transmitting property. The plastic plate is used in this embodiment, but a light transmitting substrate such as a glass plate, a PVF film (or a light transmitting film) may be used.

When the cover member 606 is prepared in this way, the cover member 606 is bonded through a filler 610 added with a drying agent 609. In a bonding process, the bonding apparatus shown in FIG. 4 may be used. Thereafter, a frame member 612 is attached by using a sealing member 611 made of an ultraviolet ray curing resin. In this embodiment, a stainless material is used as the frame member 612. Finally, an FPC 613 is attached to complete an EL display device.

Embodiment 3

Figure 7:
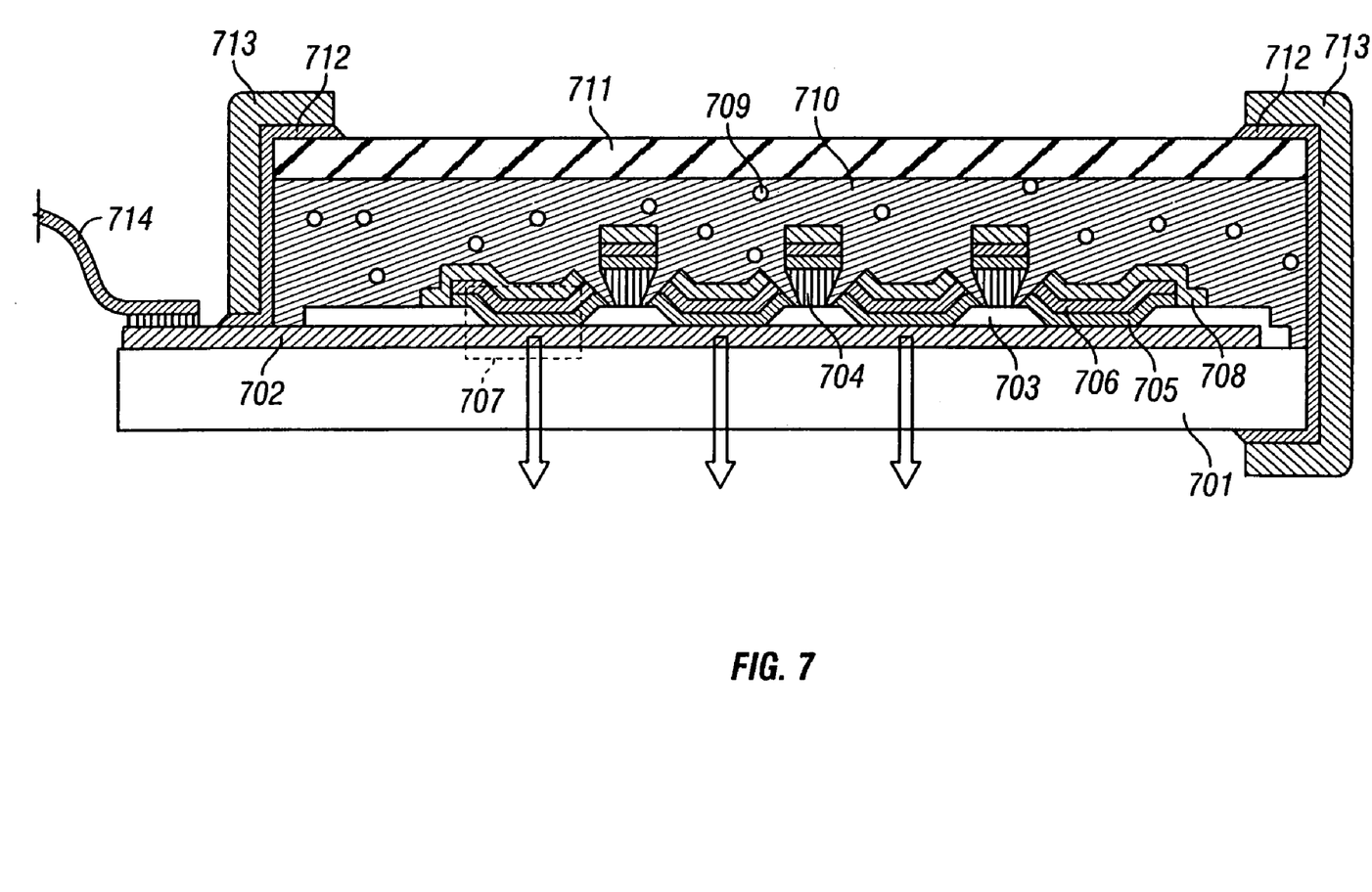
FIG. 7 is a cross-sectional side view of a simple matrix EL display device.

In this embodiment, an example of implementing the present invention in a simple matrix EL display device is shown in FIG. 7. In FIG. 7, reference numeral 701 indicates a glass substrate, and reference numeral 702 indicates an anode made of a transparent conductive film. In this embodiment, a compound of indium oxide and tin oxide is formed by a sputtering method. Note that, although not shown in FIG. 7, a plurality of anodes is arranged in stripe in a direction perpendicular to the paper.

An insulating film (a silicon nitride film in this embodiment) 703 is formed on the anode 702 by photolithography, and a spacer 704 made of resin such as acrylic or polyimide is formed on the insulating film 703. The spacer 704 is formed so as to have an upside-down triangle shape. In order to obtain the upside-down triangle shape, the resin film that becomes the spacer may be provided with a lamination structure, and the film with a faster etching rate may be used for the lower layers. Further, the spacers 704 are formed in stripe with the direction perpendicular to the paper being a longitudinal direction.

After the spacer 704 is formed, an EL layer 705 and a cathode 706 are formed in succession without breaking a vacuum by an evaporation method. As the EL layer 705, a structure is adopted, in which CuPc (copper phthalocyanine) of 30 nm thickness, TPD (triphenylamine derivative) of 50 nm thickness, and Alq (tris-8-aluminum quinolinolate complex) of 50 nm thickness are laminated from the anode side. However, the layer thickness is not limited to this. Further, an MgAg (an alloy co-evaporated with the ratio of Mg:Ag=10:1) electrode of 120 nm thickness is used as the cathode 706. Thus, an EL element emitting-green light is formed.

Being evaporated using a shadow mask, the EL layer 705 and the cathode 706 can be selectively formed without forming them in unnecessary portions. Further, since the separation of pixels 707 is conducted by the spacer 704 in a pixel portion, the pixels 707 can be integrated with high density. Of course, the EL layers 705 and the cathodes 706 are formed in stripe along the spacers 704 with the direction perpendicular to the paper being the longitudinal direction. Further, with this structure, the cathode 706 is arranged so as to be perpendicular to the anode 702.

After the completion through the formation of the cathode 706 without breaking the vacuum, an electrode made of an aluminum film is formed as a protective electrode 708 without further breaking the vacuum. The protective electrode 708 functions as a conductor for uniformly applying a voltage to the cathode 706 while functioning as a protective film for preventing oxidization of the cathode 706. Note that, although not shown in the figure, the protective electrode 708 is electrically connected with the cathode so as to apply the same voltage to all the cathodes, and is drawn out to the portion where an FPC is attached later so as to be applied with a predetermined voltage.

As described above, an EL element is formed on the substrate 601. Next, a cover member 711 is bonded by means of a filler 710 added with a drying agent 709. The bonding apparatus shown in FIG. 4 may be used in this bonding process. Then, a frame member 713 is attached using a sealing member 712 made of an ultraviolet ray curing resin. In this embodiment, a stainless material is used as the frame member 713. Finally, an FPC 714 is attached to complete an EL display device.

Note that, since the light emitted from the EL element is radiated to the side opposite to the cover member 711 with the structure of this embodiment, the cover member 711 may have light transmitting property or light shielding property. In this embodiment, a glass plate is used as the cover member 711. However, a plastic plate, a light transmitting substrate such as a PVF film (or a light transmitting film), a ceramics plate, a film in which an aluminum foil is sandwiched by a PVF film, and the like may also be used.

Embodiment 4

An EL display device formed by implementing the present invention is of a self light emitting type, and thus, it is excellent in visibility in the light in comparison with a liquid crystal display device, and also has a wide viewing angle. Therefore, the EL display device can be used as a display portion of various electronic devices. For example, the EL display device of the present invention may be used as a display portion of an EL display (a display incorporated with the EL display device in its casing) having a screen size of a 30 inch diagonal or larger (typically a 40 inch diagonal or larger) in order to watch TV broadcasting and the like with a large screen.

Note that the EL display includes all displays for displaying information such as a display for a personal computer, a display for receiving TV broadcasting, and a display for displaying an advertisement. Besides, the EL display device of the present invention may be used as a display portion of various electronic devices.

As such electronic devices according to the present invention, a video camera, a digital camera, a goggle type display (a head mounted display), a car navigation system, a sound playback device (a car audio system, an audio component stereo or the like), a notebook personal computer, a game machine, a portable information terminal (a mobile computer, a portable telephone, a portable game machine, an electronic book or the like), an image playback device equipped with a recording medium (specifically, a device which plays a recording medium such as a compact disk (CD), a laser disk (LD), or a digital video disk (DVD) and is equipped with a display that displays the image) and the like can be given. Particularly, a wideness of a viewing angle is regarded as important in the portable information terminal that is often seen from an oblique direction, and thus, the EL display device is desirably used. Specific examples of those electronic devices are shown in FIG. 8.

Figure 8A:
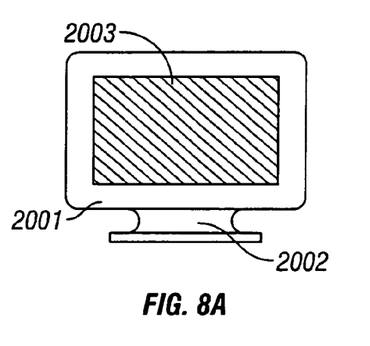
FIG. 8A is a perspective view of an EL display.

FIG. 8A shows an EL display, which contains a casing 2001, a support stand 2002, a display portion 2003 and the like. The present invention can be applied to the display portion 2003. Since the EL display is of a self light emitting type, it does not need a back light. Thus, the display portion that is thinner than a liquid crystal display can be obtained.

Figure 8B:
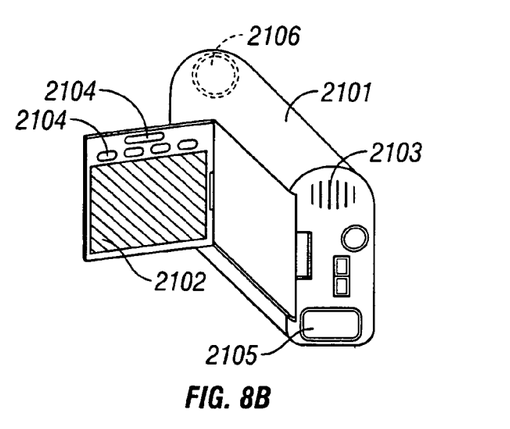
FIG. 8B is a perspective view of an EL display implemented in a video camera.

FIG. 8B shows a video camera, which contains a main body 2101, a display portion 2102, a sound input portion 2103, operation switches 2104, a battery 2105, an image receiving portion 2106 and the like. The EL display device of the present invention can be applied to the display portion 2102.

Figure 8C:
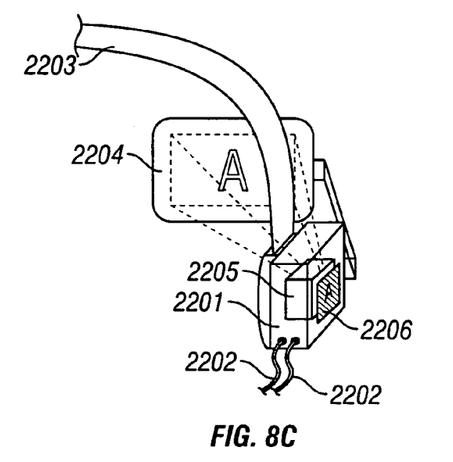
FIG. 8C is a perspective view of an EL display implemented as a head mounted display.

FIG. 8C shows a portion (right side) of a head mounted EL display, which contains a main body 2201, signal cables 2202, a head fixing band 2203, a display portion 2204, an optical system 2205, an EL display device 2206 and the like. The present invention can be applied to the EL display device 2206.

Figure 8D:
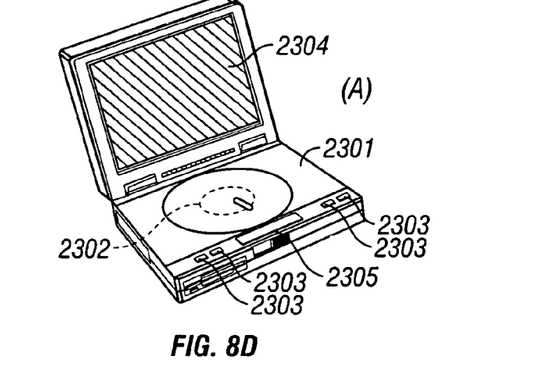
FIG. 8D is a perspective view of an EL display implemented in a DVD playback device.

FIG. 8D shows an image playback device equipped with a recording medium (specifically, a DVD playback device), which contains a main body 2301, a recording medium (such as a CD, an LD, or a DVD) 2302, operation switches 2303, a display portion (a) 2304, a display portion (b) 2305 and the like. The display portion (a) is mainly used for displaying image information. The display portion (b) is mainly used for displaying character information. The present invention can be applied to the display portion (a) and the display portion (b). Note that the image playback device equipped with the recording medium may include devices such as CD playback devices and game machines.

Figure 8E:
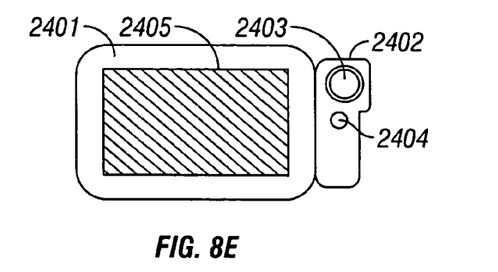
FIG. 8E is a perspective view of an EL display implemented in a device with a camera and a display portion.

FIG. 8E shows a portable (mobile) computer, which contains a main body 2401, a camera portion 2402, an image receiving portion 2403, an operation switch 2404, a display portion 2405 and the like. The EL display device of the present invention can be applied to the display portion 2405.

Figure 8F:
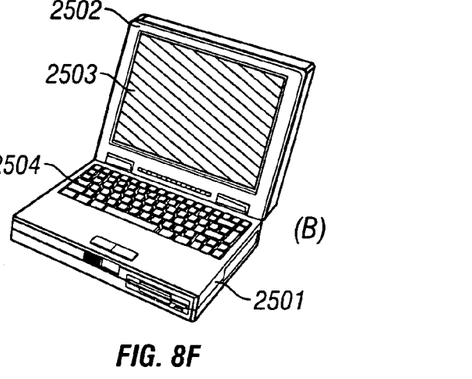
FIG. 8F is a perspective view of an EL display implemented in a portable computer.

FIG. 8F shows a personal computer, which contains a main body 2501, a casing 2502, a display portion 2503, a keyboard 2504 and the like. The EL display device of the present invention can be applied to the display portion 2503.

Note that, if emission brightness of an EL material is increased in future, it becomes possible to expand and project light including output image information by a lens or the like to be used in a front or rear type projector.

Further, the above electronic device displays information distributed through an electronic communication line such as the Internet or a CATV (cable television) in many cases, and in particular, an opportunity of displaying moving image information has been increasing. The response speed of the EL material is very high, and thus, an EL display device is preferable for moving image display. However, if the contour between pixels is blurred, then the entire moving image is also blurred. Therefore, it is very effective to use the EL display device of the present invention, which makes the contour between pixels clear, as a display portion of an electronic device.

Furthermore, in the EL display device, light emitting portions consume electric power, and thus, it is desirable that information is displayed such that the light emitting portions are reduced as much as possible. Therefore, in the case where the EL display device is used for a display portion, which is mainly used for displaying character information, such as that of the portable information terminal, particularly, the portable telephone, or the sound playback device, the EL display device is desirably driven such that character information is formed in the light emitting portions with non-light emitting portions as a background.

Figure 9A:
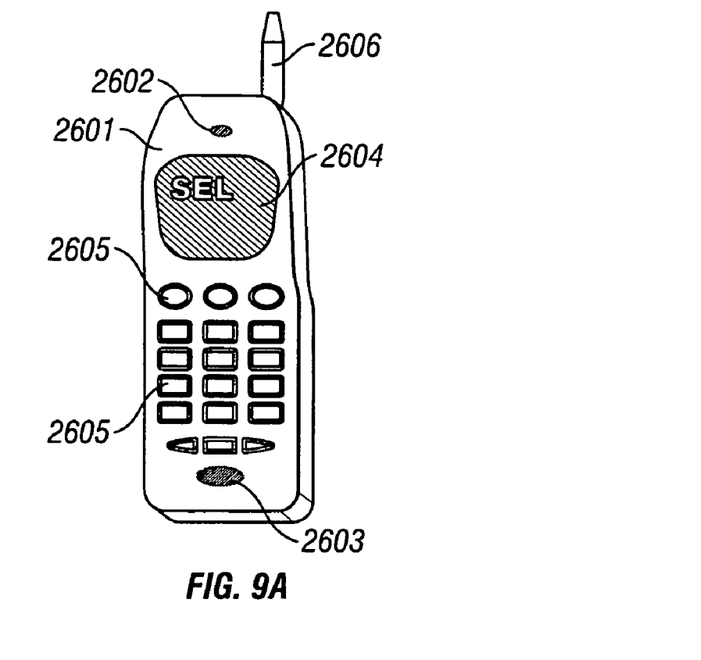
FIG. 9A is a perspective view of a portable telephone in which the EL display has been incorporated.

FIG. 9A shows a portable telephone, which contains a main body 2601, a sound output portion 2602, a sound input portion 2603, a display portion 2604, operation switches 2605, and an antenna 2606. The EL display device of the present invention can be applied to the display portion 2604. Note that white characters are displayed on a black background in the display portion 2604, and thus, power consumption of the portable telephone can be suppressed.

Figure 9B:
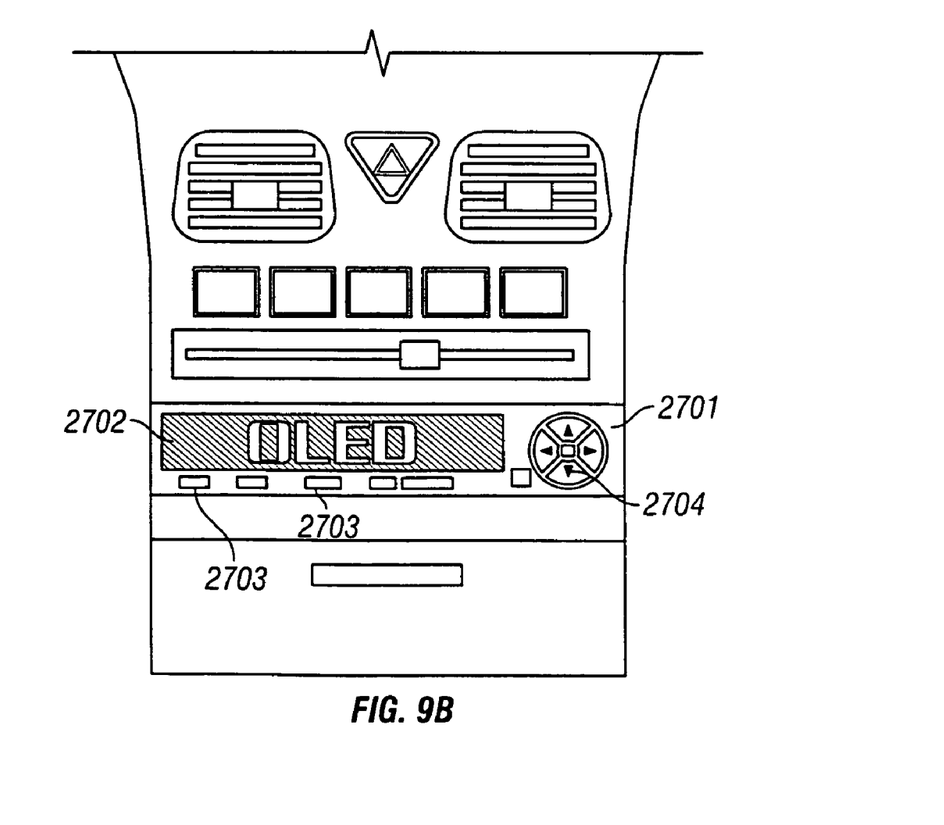
FIG. 9B is a perspective view of a car audio system in which the EL display has been incorporated.

Further, FIG. 9B shows a sound playback device, specifically, a car audio system, which contains a main body 2701, a display portion 2702, and operation switches 2703 and 2704. The EL display device of the present invention can be applied to the display portion 2702. Further, an audio system for loading on a car is shown in this embodiment, but the car audio system may be used for a portable sound playback device. Note that white characters are displayed on a black background in the display portion 2702, and thus, the power consumption can be suppressed. This is particularly effective in the portable sound playback device.

As described above, the applicable range of the present invention is extremely wide, and it is possible to apply the present invention to electronic devices in all fields. Further, the electronic device of this embodiment may use the EL display device with any constitution shown in Embodiments 1 to 7.

EFFECTS OF THE INVENTION

The deterioration of the EL element portion of the EL display device can be effectively suppressed by implementing the present invention. Therefore, the EL display device with high reliability can be obtained. Further, such an EL display device with high reliability is used as the display portion of the electronic device, whereby the reliability of the electronic device can be enhanced.

What is claimed is:

1. An electroluminescent display device comprising:
a substrate;
an electroluminescent element formed over the substrate;
a transparent cover member provided with a color filter;
a filler for adhering said substrate to said cover member;

a sealing member for covering a side surface of said filler; and a frame member adhered with said sealing member, wherein said color filter is disposed between said substrate and said transparent cover member, and the filler includes a drying agent having an average diameter of 100 μmΦ or less.

2. The electroluminescent display device according to claim 1 wherein said transparent cover member is a glass substrate.

3. The electroluminescent display device according to claim 1 wherein said transparent cover member is a plastic substrate.

4. The electroluminescent display device according to claim 1 wherein said display device is a simple matrix electroluminescent display device.

5. The electroluminescent display device according to claim 1 wherein said electroluminescent element emits white light.

6. An electroluminescent display device comprising:
a substrate;
an electroluminescent element formed over the substrate;
a transparent cover member provided with a color filter and a light shielding film;
a filler for adhering said substrate to said cover member;
a sealing member for covering a side surface of said filler; and
a frame member adhered with said sealing member,
wherein said color filter is disposed between said substrate and said transparent cover member, and the filler includes a drying agent having an average diameter of 100 μmΦ or less.

7. The electroluminescent display device according to claim 6 wherein said transparent cover member is a glass substrate.

8. The electroluminescent display device according to claim 6 wherein said transparent cover member is a plastic substrate.

9. The electroluminescent display device according to claim 6 wherein said display device is a simple matrix electroluminescent display device.

10. The electroluminescent display device according to claim 6 wherein said light shielding film comprises a resin which contains black pigment or carbon.

11. An electroluminescent display device comprising:
a substrate;
an electroluminescent element formed over the substrate;
a thin film transistor electrically connected to said electroluminescent element;
a transparent cover member provided with a color filter;
a filler for adhering said substrate to said cover member;
a sealing member for covering a side surface of said filler; and
a frame member adhered with said sealing member,
wherein said color filter is disposed between said substrate and said transparent cover member, and the filler includes a drying agent having an average diameter of 100 μmΦ or less.

12. The electroluminescent display device according to claim 11 wherein said transparent cover member is a glass substrate.

13. The electroluminescent display device according to claim 11 wherein said transparent cover member is a plastic substrate.

14. The electroluminescent display device according to claim 11 wherein said electroluminescent element emits white light.

15. An electroluminescent display device comprising:
a substrate;
an electroluminescent element formed over the substrate;
a thin film transistor electrically connected to said electroluminescent element;
a transparent cover member provided with a color filter and a light shielding film;
a filler for adhering said substrate to said cover member;
a sealing member for covering a side surface of said filler; and
a frame member adhered with said sealing member,
wherein said color filter is disposed between said substrate and said transparent cover member, and the filler includes a drying agent having an average diameter of 100 μmΦ or less.

16. The electroluminescent display device according to claim 15 wherein said transparent cover member is a glass substrate.

17. The electroluminescent display device according to claim 15 wherein said transparent cover member is a plastic substrate.

18. The electroluminescent display device according to claim 15 wherein said light shielding film comprises a resin which contains black pigment or carbon.

* * * * *